United States Patent
Yueh et al.

(10) Patent No.: US 7,867,687 B2
(45) Date of Patent: Jan. 11, 2011

(54) METHODS AND COMPOSITIONS FOR REDUCING LINE WIDE ROUGHNESS

(75) Inventors: Wang Yueh, Portland, OR (US);
Huey-Chiang Liou, Fremont, CA (US);
Hai Deng, Mountain View, CA (US);
Hok-Kin Choi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 1008 days.

(21) Appl. No.: 10/687,288

(22) Filed: Oct. 15, 2003

(65) Prior Publication Data

US 2005/0084793 A1    Apr. 21, 2005

(51) Int. Cl.
*G03F 7/004*    (2006.01)

(52) U.S. Cl. .................... 430/270.1; 430/9; 430/322; 430/311

(58) Field of Classification Search .................... None
See application file for complete search history.

(56) References Cited

U.S. PATENT DOCUMENTS

| | | | | |
|---|---|---|---|---|
| 5,358,599 A | * | 10/1994 | Cathey et al. | 438/701 |
| 5,759,739 A | * | 6/1998 | Takemura et al. | 430/270.1 |
| 6,261,738 B1 | * | 7/2001 | Asakura et al. | 430/270.1 |
| 2004/0204328 A1 | * | 10/2004 | Zhang et al. | 510/175 |
| 2005/0074699 A1 | * | 4/2005 | Sun et al. | 430/312 |

OTHER PUBLICATIONS

Lammers, David, "Euro, Japan go to extremes for EUV," EE Times, Oct. 18, 2002, 6 pages.
Ito, H., "Chemical amplfication resists: History and development within IBM," http://researchweb.watson.ibm.com/journal/rd/411/ito.txt, 1997 IBM, 12 pages.
Definition of Photoresist from Wikipedia, 2003, one page.
Medeiros, D.R., et al., "Recent progress in electron-beam resists for advanced mask-making," IBM J. Res. & Dev. vol. 45, No. 5, Sep. 2001, pp. 639-650.
Cobb, Jonathan, et al., "Controlling line-edge roughness to within reasonable limits," Proceedings of SPIE vol. 5039 (2003), pp. 376-383.
Linton, T., et al., "Determination of the Line Edge Roughness Specification for 34 nm Devices," TCAD Division, Intel Corporation, 2002 IEEE, pp. 303-306.
Stewart, Michael D., et al., "Diffusion Induced Line Edge Roughness," Advances in Resist Technology and Processing XX, Proceedings of SPIE vol. 5039, 2003, pp. 415-422.
"Introduction to Electron Beam Lithography," http://dot.che.gatech.edu/henderson/introductionto_electron_beam_lithography.htm, printed from internet on Aug. 27, 2003, 13 pages.

\* cited by examiner

*Primary Examiner*—Daborah Chacko Davis
(74) *Attorney, Agent, or Firm*—Blakely, Sokoloff, Taylor & Zafman LLP

(57)    ABSTRACT

Embodiments of the invention provide a non-chemically amplified photoresist, which results in reduced line wide roughness (LWR). In accordance with one embodiment the photoresist includes a developer-soluble resin (DSR) and a photoactive compound (PAC). For one embodiment of the invention, the even distribution of the PAC within the DSR results in reduced acid diffusion thus reducing LWR. Prior to exposure to the light source, the PAC inhibits solubility of the DSR in the developer. Upon exposure the PAC converts to acid to promote solubility of the DSR. The even distribution of the PAC within the photoresist results in reduced LWR and a reduction in defects. For one embodiment the photoresist is applied in the EUV technology (e.g., wavelength is 13.4 nm). For such an embodiment the LWR may be reduced to less than 1.5 nm allowing for effective fabrication of devices having feature sizes of approximately 15 nm.

21 Claims, 5 Drawing Sheets

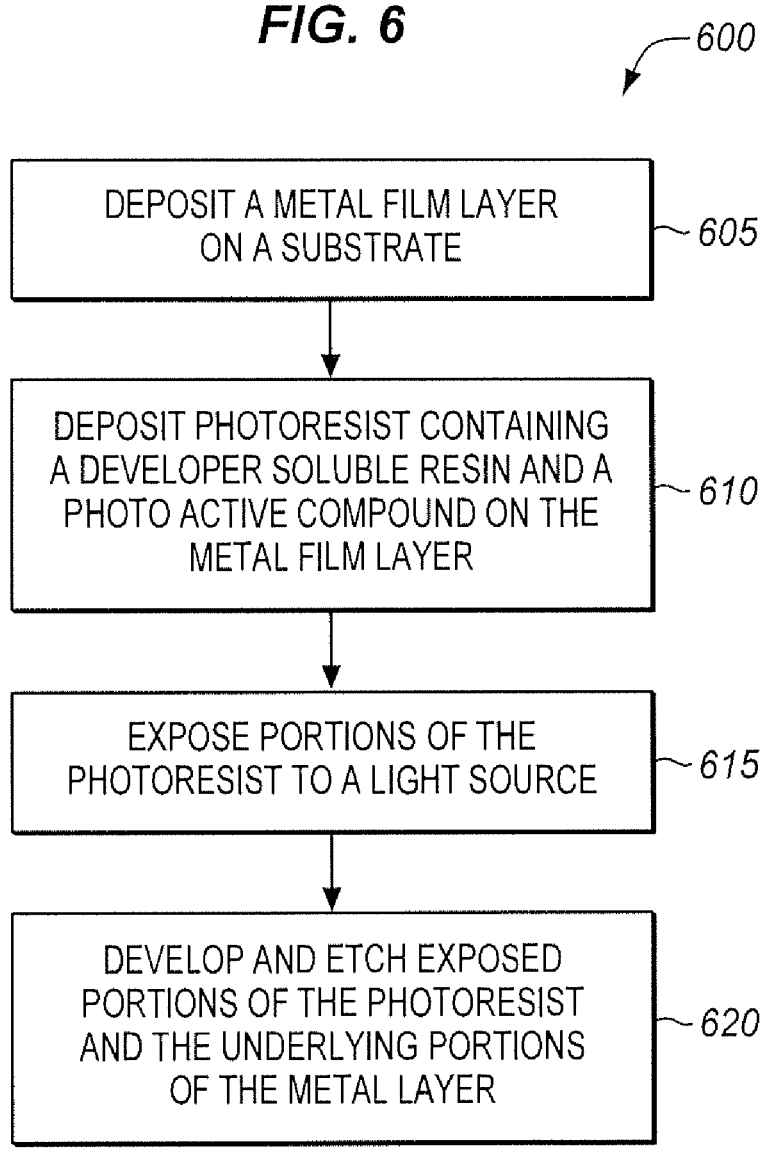

METHODS AND COMPOSITIONS FOR REDUCING LINE WIDE ROUGHNESS

FIELD

Embodiments of the invention relate generally to the field of lithography processes for semiconductor manufacturing, and more specifically to photoresists for non-chemically amplified photoresist technologies constituted to reduce line wide roughness (LWR).

BACKGROUND

The manufacture of semiconductor devices typically includes a lithography process. Lithography typically involves various combinations of material deposition, etching, and chemical treatment. A portion of a typical lithography process would proceed as follows. A film (e.g., a metal film) layer is deposited on a substrate. The film layer is typically only a few nanometers (nm) thick. A photoresist layer is then spin-coated on the substrate (i.e., over the film layer). A photoresist (i.e., a positive photoresist) is a photosensitive material that becomes more soluble in aqueous base solvent (developer) upon exposure to light. The photo resist may typically be spun on to the substrate and may include solvents to ensure a uniform coating. Such photoresists may be soft baked after deposition to drive off excess solvents. The photoresist is then selectively exposed to light in specific places. Typically a mask (i.e., a transparent plate having a printed pattern) and a light source (scanner) are used to illuminate the specified portions of the photoresist layer. Then the exposed portion of the photoresist layer (e.g. the portion rendered more soluble in the developer through exposure) is etched. Subsequently the non-exposed portion of the photoresist layer is etched leaving the patterned film layer.

Over the past decade, as the trend toward smaller feature sizes continued, chemically-amplified photoresist technologies have become more prevalent. For example, I-line, with a photoresist wavelength ($\lambda$) of 365 nm employed a non-chemically-amplified photoresist. The typical near-UV positive photoresist consists of a polymer (resin) such as novolac and a photoactive dissolution inhibitor (e.g., diazonaphthoquinone (DNQ)). As photoresist technology moved toward deep ultra-violet (DUV) ($\lambda$=248 nm, 193 nm) the typical novolac/DNQ photoresist was found to be inadequate. This was due to the inability of such photoresists to become more transparent during exposure (unbleachability) in the DUV region. Chemically-amplified photoresists were developed to address this limitation.

FIG. 1 illustrates the increase in dissolution rate of a non-chemically amplified photoresist in accordance with the prior art. As shown in FIG. 1, the dissolution rate in developer for pure novolac is decreased by the addition of the DNQ. Then upon exposure to the hv light, the dissolution rate increases substantially. This is due to the acid resulting from exposure of the DNQ. In general, for a non-chemically-amplified photoresist scheme, the solubility of the polymer in the developer is greatly increased by acid resulting from exposure of a photo-active compound (PAC).

For chemically amplified photoresists, the mechanism is different. Instead of PAC, Photoacid generator (PAG) is used. The resin (PHOST) in the photoresists are not soluble in developer. Upon exposure to the hv light, the dissolution rate increases substantially. This is due to the acid resulting from exposure of the PAG. The generated acid will deblock the PHOST to form PHS which is soluble in developer. The disadvantage of this approach is that during the post-exposure bake process, the acid produced by the exposure of the photoacid generator (PAG) will diffuse into the film. The diffusion is non-uniform and produces a situation where the polymer lacks sufficient randomness to deblock, which exacerbates the LWR problem for all wavelengths.

FIGS. 2A-2C illustrate the formation of LWR for a chemically-amplified, or non-chemically amplified, resist scheme in accordance with the prior art. As shown in FIG. 2A, a photoresist layer is deposited upon a substrate (i.e., substrate with a film layer deposited thereon). The areas of the photoresist marked with Is indicating the solubility of the photoresist in the developer is inhibited in those areas. As shown in FIG. 2B, portions of the photoresist layer are then exposed to the hv light source increasing the solubility of the photoresist in desired areas. The areas of the photoresist marked with Ps indicating the solubility of the photoresist in the developer is promoted in those areas. Upon development, the exposed portion of the photoresist is removed, as shown in FIG. 2C. However, LWR results due to the acid diffusion. The LWR typically averages more than 10 nm. This was acceptable for feature sizes larger than, approximately, 100 nm, as it amounted to only 10% of the feature size. As the reduction of feature sizes continues, the 10 nm threshold for LWR becomes unacceptable.

In prior art lithography processes, it is not possible to reduce LWR to approximately 1.5 nm, which would be acceptable for 15-16 nm feature sizes.

BRIEF DESCRIPTION OF THE DRAWINGS

The invention may be best understood by referring to the following description and accompanying drawings that are used to illustrate embodiments of the invention. In the drawings:

FIG. 6 illustrates a process by which photolithography is accomplished with substantially reduced LWR in accordance with one embodiment of the invention.

DETAILED DESCRIPTION

Embodiments of the invention provide a non-chemically amplified photoresist that results in reduced LWR.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

In accordance with one embodiment of the invention provide a photoresist that employs a developer-soluble resin and a photoactive compound (PAC).

Figure 1:
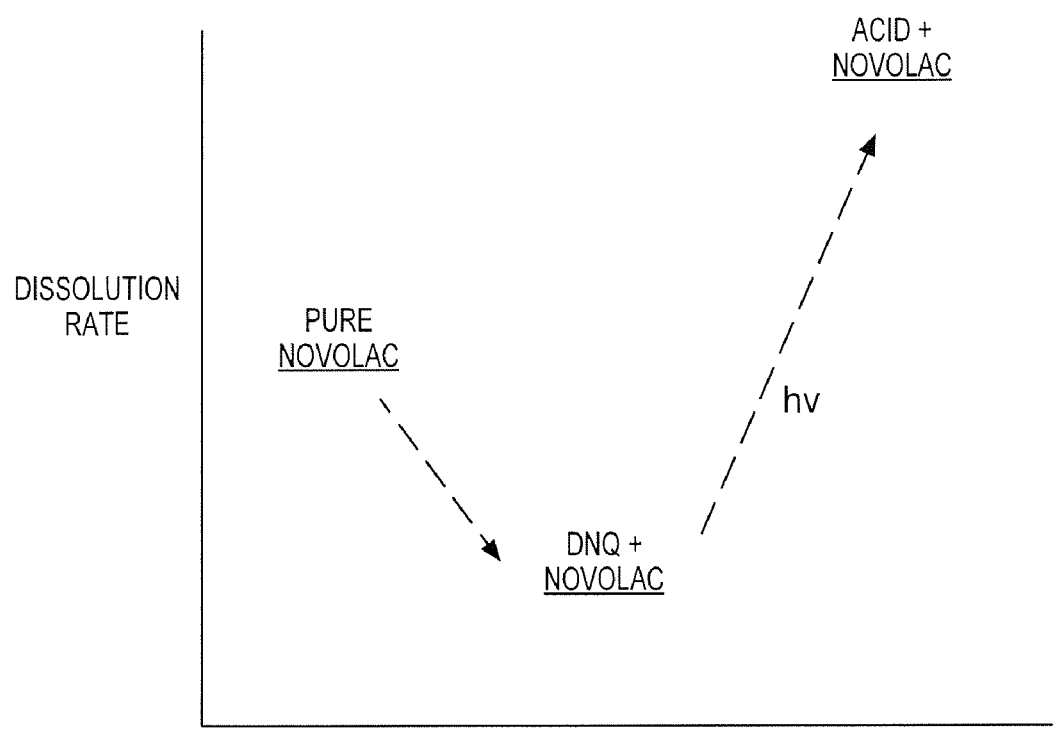
FIG. 1 illustrates the increase in dissolution rate of a non-chemically amplified photoresist in accordance with the prior art.
Figure 2A:
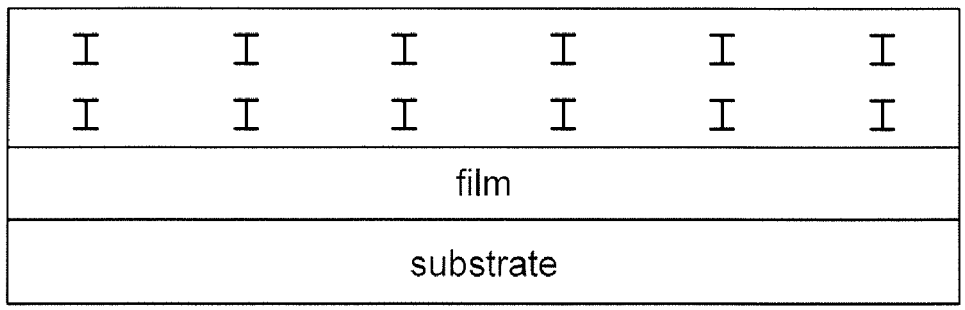
FIGS. 2A-2C illustrate the formation of LWR for a chemically-amplified, or non-chemically-amplified, resist scheme in accordance with the prior art.
Figure 2B:
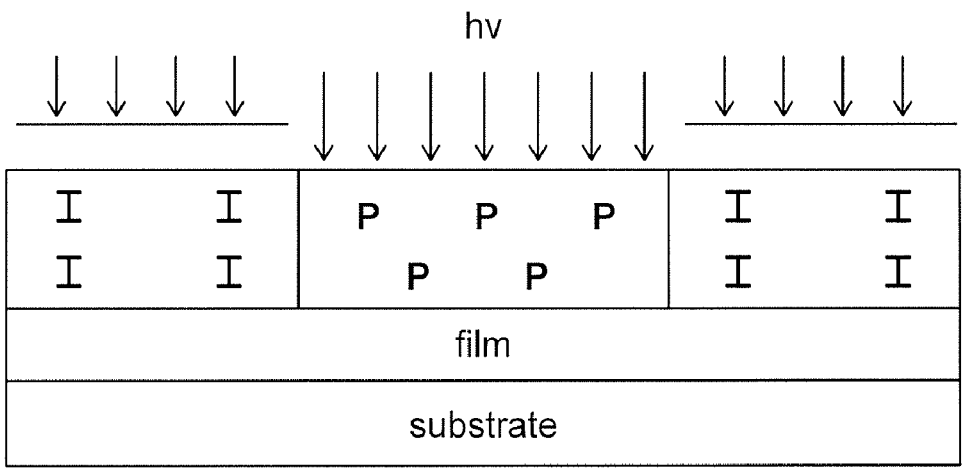
Figure 2C:
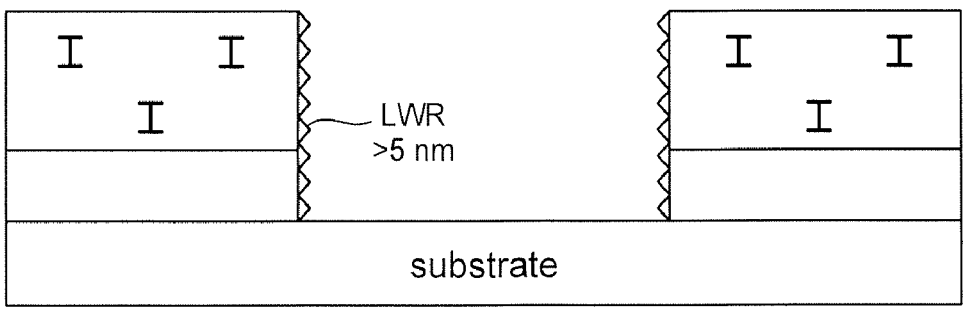
Figure 3:
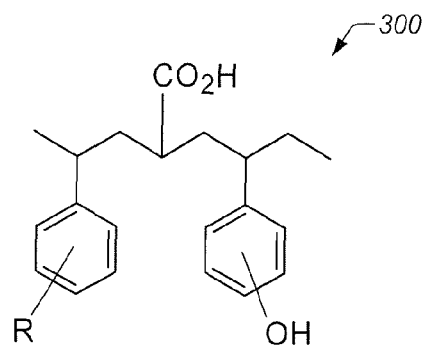
FIG. 3 illustrates a developer-soluble resin for use as a component of a photoresist in accordance with one embodiment of the invention.

FIG. 3 illustrates a developer-soluble resin (DSR) for use as a component of a photoresist in accordance with one embodiment of the invention. The DSR 300, shown in FIG. 3, is soluble in typical aqueous-base developers (e.g., 0.26N tetra-methyl ammonium hydroxide in water). The solubility of the DSR in developer is reduced by blending the DSR with the PAC.

In various alternative embodiments the DSR may be made by vinyl acid, vinyl phenol, and vinyl phenol substitutes, among others, through free radical polymerization.

Figure 4:
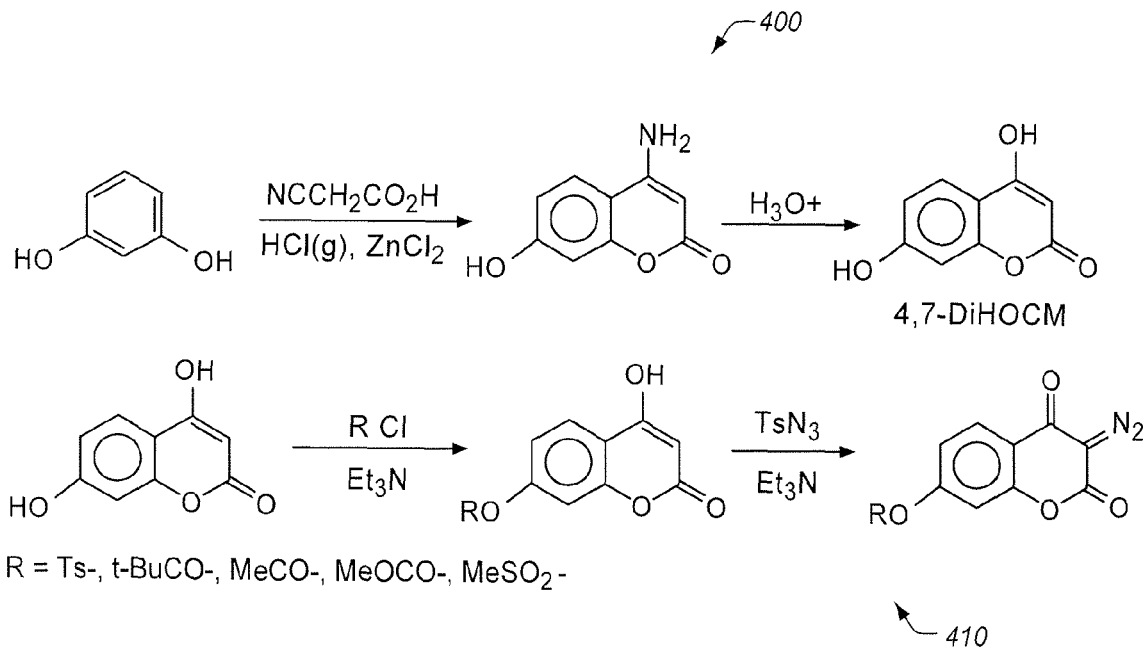
FIG. 4 illustrates a photoactive compound for use as a component of a photoresist in accordance with one embodiment of the invention.

FIG. 4 illustrates the synthesis of a PAC for use as a component of a photoresist in accordance with one embodiment of the invention. As shown in FIG. 4, synthesis 400 produces PAC 410 that includes a ballast group. The ballast group, R, may be any cage, phenyl, or phenyl-substituted group. The photo-speed, and developer solubility, can be modified, by varying the ballast group (e.g., between electron donating and electron withdrawing).

Figure 5:
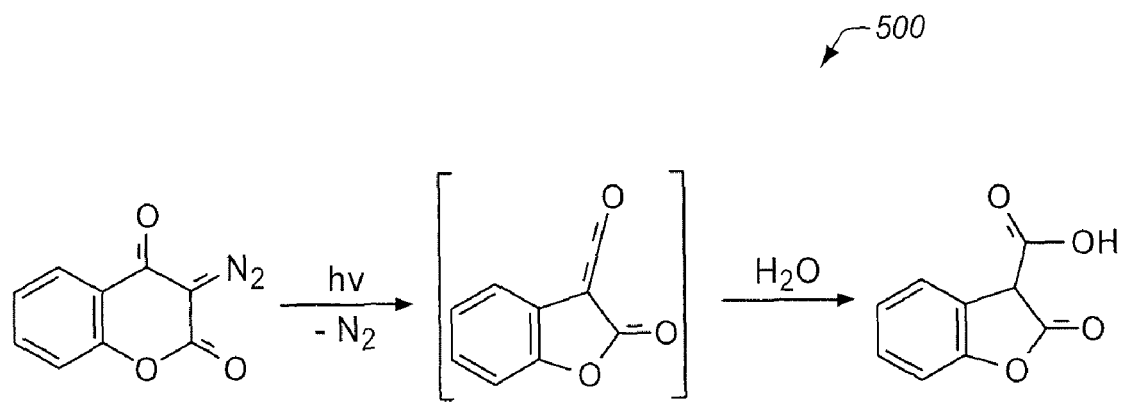
FIG. 5 illustrates the reaction of the photoactive compound upon exposure to the light source in accordance with one embodiment of the invention.

FIG. 5 illustrates the reaction of the PAC upon exposure to the light source in accordance with one embodiment of the invention. The reaction 500, shown in FIG. 5, releases nitrogen and forms carbonyl acid through a photo-induced decomposition of the PAC (Wolff rearrangement). The acid promotes the solubility of the DSR in the developer and because there is limited acid diffusion the LWR is substantially reduced. For one embodiment the resulting average LWR will be reduced.

Process

FIG. 6 illustrates a process by which photolithography is accomplished with substantially reduced LWR in accordance with one embodiment of the invention. Process 600, shown in FIG. 6, begins at operation 605 in which a film is deposited upon a substrate. For various embodiments of the invention the substrate may be a semiconductor wafer, glass, ceramic, or any suitable material. The film layer may be a metal film layer, typically aluminum, copper, tantalum, or other metals or may be a layer of semiconductor material (e.g. silicon).

At operation 610 a photoresist layer is deposited upon the film layer. In accordance with one embodiment of the invention, the photoresist includes a DSR and PAC. For one embodiment the DSR may be a polyhydroxystyrene-based (PHS-based) compound as illustrated in FIG. 3, and as described above in reference to FIG. 3.

The photoresist may be spun onto the substrate to ensure a uniform coating and to evenly distribute the PAC within the photoresist. The PAC reduces the DSR solubility in the developer through hydrogen bonding.

At operation 615 the photoresist is masked and exposed to a light source. For one embodiment the wavelength of the light source is in the extreme ultraviolet (EUV) region. During exposure the incident light decomposes the PAC. The PAC will convert to carbonyl acid that promotes the solubility of the DSR in the developer. The unexposed portions of the photoresist, which contains PAC inhibits the dissolution of the photoresist in these areas.

At operation 620 the exposed portions of the photoresist layer are developed and etched using a conventional etching technique. In accordance with one embodiment of the invention, because the PAC is evenly distributed in the photoresist film, resulting in reduced and uniform acid diffusion (relative to prior art schemes), the LWR is substantially reduced.

General Matters

Embodiments of the invention provide a non-chemically amplified photoresist (i.e., does not include PAG), which results in reduced LWR. In accordance with one embodiment the photoresist includes a DSR and a PAC. For one embodiment of the invention, the even distribution of the PAC within the DSR results in substantially reduced acid diffusion thus reducing LWR. Prior to exposure to the light source, the PAC inhibits solubility of the DSR in the developer. Upon exposure the PAC converts to acid to promote solubility of the DSR in the developer. The uniform distribution of the PAC within the photoresist results in substantially reduced LWR as well as a reduction in defects such as nubs, points, and black dot defects.

For one embodiment the photoresist is applied in the EUV technology (e.g., wavelength is 13.4 nm). For such an embodiment the LWR may be reduced to a desired length of less than 1.5 nm, allowing for effective fabrication of devices having feature sizes of approximately 15 nm.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   depositing a layer on a substrate;
   depositing a non-chemically amplified photoresist layer upon the layer, the non-chemically amplified photoresist layer having a developer-soluble resin that is a polyhydroxystyrene-based compound suitable for extreme ultraviolet light lithography and a photoactive compound, the photoactive compound inhibiting solubility of the developer-soluble resin, wherein the photoactive compound has groups including an oxygen containing group and a nitrogen containing group that are capable of undergoing a decomposition reaction according to a Wolff rearrangement, when exposed to an extreme ultraviolet light, to form a carbonyl acid group;
   exposing selected portions of the non-chemically amplified photoresist layer to the extreme ultra-violet light such that solubility of the selected portions of the non-chemically amplified photoresist layer is promoted; and
   developing the exposed portions of the non-chemically amplified photoresist layer.

2. The method of claim 1, wherein the photoactive compound comprises a ballast group selected from a group consisting of from a cage, a phenyl group, and a phenyl-substituted group.

3. The method of claim 1, wherein the solubility of the selected portions of the non-chemically amplified photoresist layer is promoted by the photoactive compound forming the carbonyl acid.

4. The method of claim 1, wherein the developer-soluble resin is produced through a free radical polymerization process using a component selected from a group consisting of vinyl acid, vinyl phenol, and vinyl phenol substitutes.

5. The method of claim 1, wherein the non-chemically amplified photoresist layer does not include a photo-acid generator (PAG).

6. The method of claim 1 further comprising:
etching portions of the layer underlying the exposed portions of the non-chemically amplified photoresist layer; and
etching a remaining portion of the non-chemically amplified photoresist layer to produce a patterned layer having one or more features, at least one of the features having a critical dimension of approximately 15 nanometers.

7. The method of claim 6, wherein the at least one feature has a line wide roughness of less than 2 nanometers.

8. The method of claim 1, wherein the photoactive compound comprises a means for venerating the carbonyl acid when exposed to the extreme ultra-violet light.

9. The method of claim 1, wherein the photoactive compound comprises a means for undergoing the Wolff rearrangement when exposed to the extreme ultra-violet light.

10. A non-chemically amplified photoresist comprising:
a resin that is soluble in a developer; and
a photoactive compound, the photoactive compound distributed within the non-chemically amplified photoresist, the photoactive compound to promote solubility of a selected portion of the non-chemically amplified photoresist exposed to an extreme ultra-violet light and to inhibit solubility of an unexposed portion of the non-chemically amplified photoresist, wherein the photoactive compound has groups that include oxygen and nitrogen and that are capable of undergoing a decomposition reaction, when exposed to the extreme ultraviolet light, to form a carbonyl acid group.

11. The non-chemically amplified photoresist of claim 10, wherein the resin comprises a polyhydroxystyrene-based compound.

12. The non-chemically amplified photoresist of claim 10, wherein the solubility of the selected portion of the non-chemically amplified photoresist is promoted by the photoactive compound forming the carbonyl acid group.

13. The non-chemically amplified photoresist of claim 12, wherein the photoactive compound comprises a ballast group.

14. The non-chemically amplified photoresist of claim 10, wherein the resin is produced through a free radical polymerization process using a component selected from a group consisting of vinyl acid, vinyl phenol, and vinyl phenol substitutes.

15. The non-chemically amplified photoresist of claim 10, wherein the photoactive compound is capable of undergoing the decomposition reaction through a Wolff rearrangement.

16. The non-chemically amplified photoresist of claim 10, wherein the photoactive compound comprises a means for undergoing a Wolff rearrangement.

17. The non-chemically amplified photoresist of claim 10, wherein the photoactive compound comprises means for generating a carbonyl acid upon exposure to the extreme ultra-violet light.

18. The non-chemically amplified photoresist of claim 10, wherein the resin comprises a polyhydroxystyrene-based compound.

19. The non-chemically amplified photoresist of claim 10, wherein the resin is substantially transparent to the extreme ultra-violet light.

20. The photoresist of claim 10, wherein the resin is based on polyhydroxystyrene, and wherein the photoactive compound is operable to produce the carbonyl acid through Wolff rearrangement.

21. A non-chemically amplified photoresist comprising:
a developer soluble resin, that is transparent to an extreme ultra-violet light, that is a polymer of vinyl compounds, and that is soluble in a developer; and
a photoactive compound, the photoactive compound distributed within the non-chemically amplified photoresist, the photoactive compound to promote solubility of a selected portion of the non-chemically amplified photoresist exposed to the extreme ultra-violet light and to inhibit solubility of an unexposed portion of the non-chemically amplified photoresist, wherein the photoactive compound is capable of undergoing a decomposition reaction, when exposed to the extreme ultra-violet light, to form a carbonyl acid group.

* * * * *

UNITED STATES PATENT AND TRADEMARK OFFICE
CERTIFICATE OF CORRECTION

| | | |
|---|---|---|
| PATENT NO. | : 7,867,687 B2 | Page 1 of 1 |
| APPLICATION NO. | : 10/687288 | |
| DATED | : January 11, 2011 | |
| INVENTOR(S) | : Yueh et al. | |

It is certified that error appears in the above-identified patent and that said Letters Patent is hereby corrected as shown below:

In column 5, at line 18 delete, "venerating" and insert --generating--.

Signed and Sealed this
Twenty-eighth Day of June, 2011

David J. Kappos
*Director of the United States Patent and Trademark Office*